United States Patent [19]
Mesquida

[11] Patent Number: 4,703,219
[45] Date of Patent: Oct. 27, 1987

[54] OPTICAL DEVICE FOR CONCENTRATING THE LIGHT RADIATION EMITTED BY A LIGHT EMITTING DIODE, AND A LIGHT EMITTING DIODE COMPRISING A DEVICE OF THIS NATURE

[75] Inventor: Guy Mesquida, Orsay, France
[73] Assignee: Thomson-CSF, Paris, France
[21] Appl. No.: 667,348
[22] Filed: Nov. 1, 1984
[30] Foreign Application Priority Data
Nov. 4, 1983 [FR] France .................... 83 17583
[51] Int. Cl.$^4$ .................... H01J 5/16; H01L 31/12
[52] U.S. Cl. .................... 313/111; 313/499; 357/17
[58] Field of Search .................... 313/498–502, 313/512, 506, 111, 358, 510; 362/800; 357/17, 30; 340/782, 757, 762, 783

[56] References Cited
U.S. PATENT DOCUMENTS

| | | | |
|---|---|---|---|
| 3,812,516 | 5/1974 | Hayashi | 357/17 X |
| 3,816,847 | 6/1974 | Nagao | 357/17 |
| 3,947,840 | 3/1976 | Craford et al. | 340/782 X |
| 3,954,534 | 5/1976 | Scifres et al. | 313/500 X |
| 4,165,474 | 8/1979 | Myers | 313/512 X |
| 4,367,483 | 1/1983 | Takahashi et al. | 357/17 X |
| 4,467,193 | 8/1984 | Carroll | 362/800 X |
| 4,599,537 | 7/1986 | Yamashita | 313/501 |

FOREIGN PATENT DOCUMENTS 0101368 2/1984 European Pat. Off. ............ 313/499

*Primary Examiner*—David K. Moore
*Assistant Examiner*—Sandra L. O'Shea
*Attorney, Agent, or Firm*—Oblon, Fisher, Spivak, McClelland, & Maier

[57] ABSTRACT

A device for optically coupling a light emitting diode and a radiation pickup such as an optical fiber. The light emitting diode element includes at least one emissive section within an active layer where a part of the light irradiation does not emerge from the diode element if it is emitted at an excessive angle of incidence. A lenticular element in the form of either a semi-cylindrical lens or a semi-toroidal lens is associated with the emissive section. In one form, the device includes a circular central lens and a plurality of semi-toroidal lens concentric with respect to the central lens and associated with annular emissive sections.

13 Claims, 9 Drawing Figures

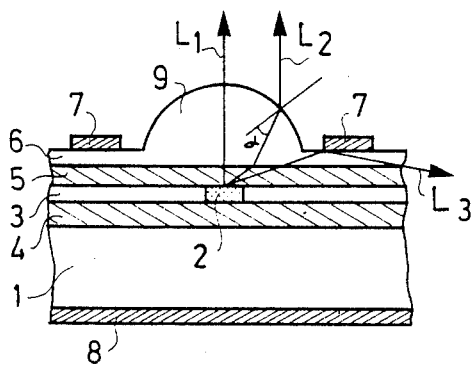
FIG.1 PRIOR ART
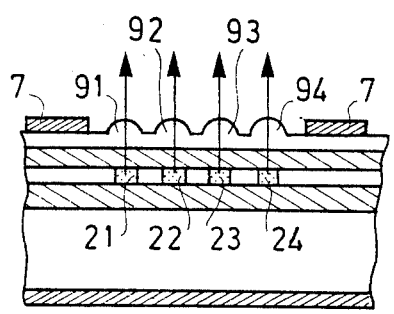
PRIOR ART FIG.2
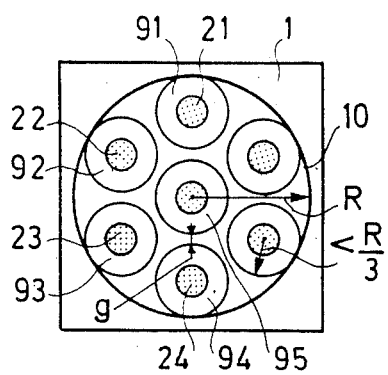
FIG.3 PRIOR ART
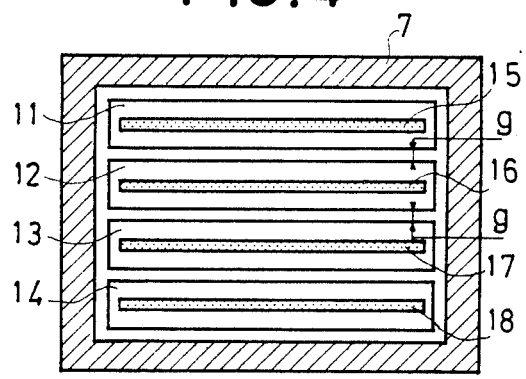
FIG.4
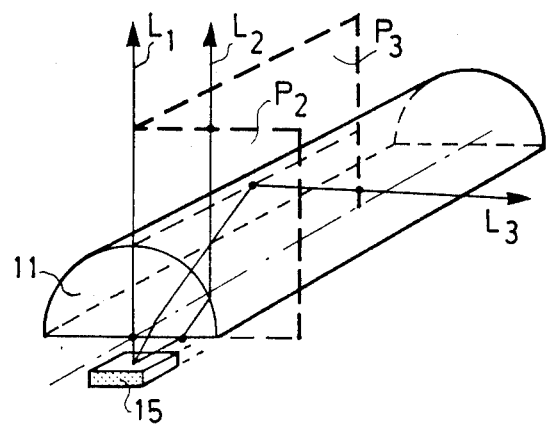
FIG.5

OPTICAL DEVICE FOR CONCENTRATING THE LIGHT RADIATION EMITTED BY A LIGHT EMITTING DIODE, AND A LIGHT EMITTING DIODE COMPRISING A DEVICE OF THIS NATURE

BACKGROUND OF THE INVENTION

The present invention has as its object an optical device for concentrating the light emitted by an electroluminescent or light emitting diode, this device being integrated in the light emitting diode and formed within one of the layers of semiconductive material forming the diode. It is characterised in that at the surface of the diode, it comprises at least one semi-torus lens surrounding a central lens, the said torus forming a complete ring in the plane of the diode surface and being cut in the direction of its thickness. The invention equally relates to the light emitting diode with which this optical device is associated.

The invention is applicable to light emitting diodes in general, whether these are of the kind emitting through the top, meaning through the surface opposed to the substrate, which are better known as "top emitting", or of the "Burrus" type, that is to say emitting through a hole made in the substrate, the diode being inverted with respect to its substrate and welded to its base via deposited layers and no longer via its substrate, as in common practice. This is why the internal structure of the diode will not be given in particular in the description of the invention since it is not affected by the latter.

It is apt however to specify that the invention is applicable to the light emitting diodes produced from substances of the IIIrd to Vth groups and in particular alloys based on gallium and arsenic, such as GaAs and $Ga_xAl_{1-x}As$ which are the most usual without thereby being restrictive.

The problem for which the invention provides a solution is that of the optical coupling between a light emitting diode and an optical fibre, for all the telecommunications, data processing and office automation systems making use of interfaces of the fibre type.

It is known that light emitting diodes have a very low external quantitative efficiency, commonly being ofthe order of 2%. The optical power plotted in a Lambertian emission graph is actually limited by total reflection within the semiconductive material which occurs at the interface between the semi-conductive element of the diode and the air.

The efficient solution of this power loss problem consists in installing an output lens at the surface of the diode. Adapting the refractive indices of the different media and the shape of the lens, renders it possible in this manner to recover a greater quantity of the light emitted by the active layer of the light emitting diode.

One of the problems, amongst others, is that of the dimensions of the optical device installed on the diode. The limitation of the thickness of the layers which may be deposited limits the radius of the lenses which may be cut in these layers and consequently the quantity of light recovered by each lens: a lens of large diameter recovers more light but requires a thick layer, whereas it is impossible to produce layers exceeding approximately 20 microns in thickness. To secure a more intense light beam at the extremity of the optical fibre, it has been proposed to associate several lenses side-by-side, corresponding to as many emissive portions within the body of the diode. Associating circular lenses does not provide an optimum however: a substantial fraction of the surface, in the form of curvilinear triangles inserted between the lenses, is unused in the upper plane of the diode, in which plane the lenses are contiguously situated.

SUMMARY OF THE INVENTION

In accordance with the invention, a light emitting diode comprises - on the surface through which the light emerges - a central circular lens and surrounding the same, at least one other planoconvex lens in the form of a torus, this torus being cut along a plane parallel to the plane of the surface through which the light emerges. The area occupied by the optical device is increased by comparison to the area of the diode, and the unused surfaces are limited to the clearances between lenses, required during the production of the said lenses.

The light emitting diode associated with an optical device of this kind comprises either a single emissive portion covered by the cental lens and the toroidal lenses, or a central emissive portion corresponding to the central lens, and as many annular emissive portions as there are toroidal lenses.

In a more precise manner, the invention relates to an optical device for concentrating the light radiation emitted by a light emitting diode, comprising at least one strip-shaped emissive portion established in the active layer of the said diode, this optical device being characterised in that formed within a layer deposited on the surface of the diode in the path of the light rays and consisting of a material transparent to the wavelength of the radiation emitted by the diode, at least one planoconvex lenticular element associated with the emissive portion of the active layer, this lenticular element having a finite radius of curvature in a plane at right angles to the strip of the emissive section, and an infinite radius of curvature in a plane tangent to the same emissive section strip.

BRIEF DESCRIPTION OF THE DRAWINGS

A clearer grasp of the invention will be gained from the following particular description elucidating a form of embodiment of light emitting diodes equipped with an optical system and based on the accompanying drawings, in which:

FIG. 1 illustrates a view in cross-section of a top emitting light emitting diode equipped with a lens in accordance with the prior art, FIG. 2 illustrates a view in cross-section of a light emitting diode equipped with a grid of lenses in accordance with the prior art, FIG. 3 illustrates an arrangement of the lenses of the preceding figure as seen in plan view, FIG. 4 illustrates an optimised pattern of the lenses establishing stage of the invention, FIG. 5 illustrates a diagram of the refraction of a light beam in a semicylindrical lens.

DESCRIPTION OF THE PREFERRED EMBODIMENT

Figure 6:
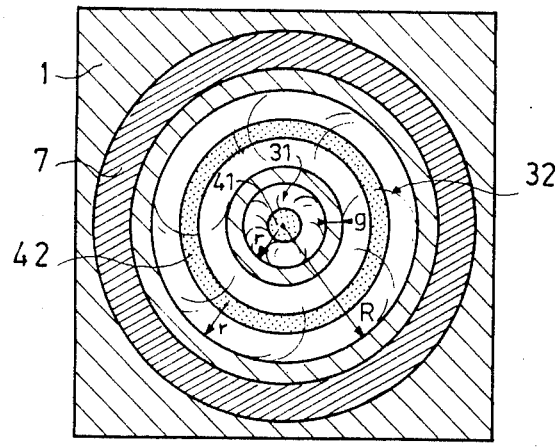
FIG. 6 illustrates a plan view of a light emitting diode equipped with the optical device according to the invention.

FIG. 1 illustrates a view in cross-section of a top emitting light emitting diode equipped with a lens, for example such as described in the French Patent Application No. FR-A- 82 13926 of Aug. 10, 1982, filed by the applicants.

A light emitting diode of this kind comprises what is to be referred to by body of the diode in the following, and whereof the precise details are not apt to be given since it lies beyond the scope of the invention. This body comprises at least one substrate 1 and an emissive section 2 comprised within an active layer 3 delimited by two containing layers 4 and 5. A contact layer 6 deposited on the surface opposed to that of the substrate 1 bears the ohmic contact 7 which allows of applying a voltage to the light emitting diode, the other contact 8 being taken on the substrate. In the contact layer 6 which had been thicker initially, has been cut out a lens 9 which renders it possible to recover the light rays emerging from the emissive section 2, in a manner such as to increase the optical power transmitted to the optical fibre which is not illustrated in this figure, but which lies close to the lens 9. The light rays like L1 which are at right angles to the output plane of the light emitting diode are transmitted without any trouble. The light rays like L2 are transmitted to the extend that the angle $\alpha$ they subtend within the semiconductive material with the line at right angles to the interface plane of the semiconductive material and air is smaller than 16° 4′ for a material like GaAlAs whereof the refractive index is of the order of n=3.5, with n=1 for air. Finally, the light rays like L3 sloping considerably with respect to the line at right angles to the emission plane, reach the interface between the semiconductive material and the air at an angle $\alpha$ greater than 16° 4′, are reflected and lost since they do not issue from the light emitting diode.

The dimensions of the optical device, that is to say the radius of the lens 9, which should be such as to assure an adequate power gain without excessive increasing the operating current of the component, since an increase of the current density in the emissive section 2 causes heating of the light emitting diode. The layer of material into which the optical device is to be cut should be thick in view of this circumstance, in a manner such that a lens 9 of substantial radius may be cut. It is technically very difficult however to obtain double hetero structures of the nature of light emitting diodes with final layers of Ga Al As of a thickness exceeding several tens of microns, 20 microns being a mean representing reality.

On the other hand, the collective technologies for production of optical systems integrated in layers of material are the more reliable and reproducible, the smaller the dimensions of these optical systems are. There are thus two difficulties which combine to militate against the output lens of a light emitting diode being of substantial size.

It is for the purpose of eliminating these disadvantages of thick layers, which are impossible to provide for obtaining a sizeable optical surface, that the applicants had proposed in the aforesaid patent application that the emissive surface of the diode be divided into a plurality of small emissive surfaces, such as 21, 22, 23 and 24 in FIG. 2, each emissive surface having allocated to it a lens within the contact surface, being the four lenses 91, 92, 93, and 94 for the four emissive surfaces referred to, without this number being restrictive.

The solution offered in FIG. 2 consequently has the advantage of requiring no more than a possible thickness of the last layer in the production of the diode, meaning a thickness in which it remains possible to cut lenses 91 to 94: several tens of microns easily secured by deposition. The series of lenses of surfaces of comparatively small diameter allowing of transmission of light to an optical fibre are cut into this layer by means of a collective and well controllable method.

The principle governing the production of a light emitting diode according to FIG. 2 consequently consists in the even division of the emissive section into several small elementary sections 21, 22, 23 and 24, in a manner such that a lens cut direct into the structure by means of a collective machining technique may be integrated more easily above each of them. This principle may be applied to the surface emission diodes of the top emitting type, or to the "Burrus" diodes. As a matter of fact, it is known that the "Burrus" diode has a definite advantage over the top emitting diode: its more satisfactory cooling. Being welded to its carrier via the side of the deposited layers, the dissipation of heat towards the casing occurs more easily in a "Burrus" diode than in the case of a top emitting diode.

The density of circular lenses does not however correspond to an optimisation of the recovery of light rays by means of optical devices. FIG. 3, which illustrares a plan view of FIG. 2, shows the pattern of the lenses in the light emitting diode and will render it possible to grasp that this system has not as yet been optimised.

Let 1 be the substrate which carries a light emitting diode on which are shown - solely by way of example and to avert overcrowding the drawing - 7 emissive sections 21, 22, 23 . . . etc. allocated to 7 lenses 91, 92, 93 . . . etc., distributed in a ring of 6 lenses around a central lens. This structure is inscribed within a circle 10 having the radius R which may at most be inscribed within the square of substrate carrying the diode. Since the example selected adopts a ring of lenses 91, 92 . . . around a central lens 95, the radius of these elementary lenses is equal to R/3 at most. The surface area occupied by 7 elementary lenses of a radius of R/3 within a circle having a radius R is equal to 78% of the surface area of the large circle: consequently, the maximum of the light emitted by the diode which may be recovered is 78% if it is accepted that this light emerges throughout its top surface.

Beyond this however, the production of diodes requires masking operations and it is known that a clearance g has to be left in being between two patterns within a resin mask to prevent fusion of the two patterns into one by the action of capillarity forces. Consequently, if R is the radius of the circle wherein are inscribed the lenses, these have a maximum radius of R/3−g, R/3 being linked with the fact that there is one ring of lenses only around the central lens in the example selected. The magnitude of the loss still incurred will be demonstrated by means of an example. If the optical fibre with which the light emitting diode is to be associated has a radius of 50 microns, the elementary lenses may have as their radius no more than 50/3 $\mu$ minus the clearance measurement which may be assumed to be g=5 microns, that is to say R/10, for conventional masking operations. A simple calculation renders it possible to reach the following result: the 7 elementary lenses cover 336/900-ths of the surface area of the circle $\pi R^2$, or that the presence of the clearance g needed for production of the elementary lenses or the density of the lenses on the surface of the diode restricts the output to 37.42% of the possible surface.

Furthermore and as a result, the limitation in surface of the elementary lenses like 91 leads to working with high injection densities per emissive section such as 21, in a manner such as to secure greater light intensity, but leads to a heating action on the light emitting diode.

FIG. 4 illustrates a first stage corresponding to the development of the invention.

Let us assume that the substrate 1 of the light emitting diode has the same dimensions as the substrates of the light emitting diodes illustrated in the preceding figures. Within the square of this substrate it is possible to inscribe a circle 10 of radius R of the same size as that depicted in FIG. 3, this circle lying within the contact area 7 which is mandatorily deposited on the surface of a light emitting diode. Instead of forming circular emissive sections like 21, 22 . . . associated with hemispherical lenses like 91,92 . . . however, the light emitting diode comprises at least one emissive section in the form of a strip and a lens having a finite radius of curvature in a plane at right angles to the strip of emissive section, and an infinite radius of curvature in a plane tangent to the same strip. The semicylindrical lenses are a first case illustrated, and the semicylindrical lenses 11, 12, 13, 14 cover the greatest possible proportion of the surface area available within the metallisation of the contact surface 7. These cylindrical lenses have corresponding to them emissive sections 15, 16, 17, 18 established within the active layer of the light emitting diode, these emissive sections being centered with respect to the cylindrical lenses 11, 12, 13 . . . The fact that a light emitting diode comprising 4 emissive sections and 4 cylindrical lenses has been described does not in any way restrict the ambit of the invention.

A system of this nature allows of covering a much greater area of the surface of the light emitting diode, since it is sufficient to have a clearance area between the cylindrical lenses whilst there is no longer any equivalent to the curvilinear triangles depicted in FIG. 3. Furthermore, the emissive sections 15, 16, 17, 18 having a greater overall surface area than the emissive sections of circular form like 21, a lesser superficial injection density than in the preceding case of the circular lenses allows of less intensive heating of the light emitting diode.

As apparent from FIG. 5 however, this pattern of emissive sections and lenses has not as yet been optimised completely.

Let us consider - in FIG. 5 - the light radiation coming from an emissive section element 15, in the direction of a semicylindrical lens 11. A first light ray L1 which strikes the plane surface of the semicylindrical lens under an orthogonal angle is transmitted outwards direct towards the optical fibre. A second ray L2 present in a plane P2 at right angles to the principal axis of the semicylindrical lens 11, is deflected by this lens and recovered by the optical fibre, subject to the sole condition that the angle of incidence of the say L2 at the interface between the lens 11 and the abient air should be smaller than 16° 4'. A third light ray L3 emitted by the emissive element 15 in a plane P3 parallel to the principal axis of the semicylindrical lens 11 may be recovered in the direction of the optical fibre if its angle of incidence is smaller than 16° 4' but it may equally be lost if, as illustrated in FIG. 5, it is too slanting and has an angle of incidence exceeding 16° 4' at the surface of the semicylindrical lens.

A system of this nature, based on semicylindrical lenses, thus allows of greater useful surface coverage at the surface of the diode, and equally renders it possible to have emissive sections 15,16 . . . which operate under a lower injection density to secure the same light emission. However, this geometry does not prevent the loss of a part of the radiation which is reflected along the principal axis of the lenses, as in the case of the ray L3 of FIG. 5.

FIG. 6 illustrates a plan view of the top surface of a light emitting diode equipped with the optical device according to the invention.

Let 1 be a light emitting diode element 1, whereof the surface opposed to that of the substrate carries a contact surface metallisation 7. Into the top layer of this light emitting diode are cut at least one central hemispherical lens 31 and at least one semi-toroidal lens 32 concentric with respect to the central lens 31. The term semi-toroidal lens 32 should be interpreted to the effect that the lens 32 forms a complete circle around the central lens 31 but that as seen in cross-section and in the direction of its thickness, it is no more than a fraction of a torus since—by definition—a torus is generated by a circle displaced around a point external to the same. Consequently, as will be shown in FIG. 7, the semi-toroidal lens 32 has a cross-section in a plane at right angles to the principal plane of the light emitting diode which is a fraction of a circle.

Each of the lenses forming the optical device of the light emitting diode has allocated to it an emissive section: the emissive section 41 corresponding to the central circular lens 31 is itself a circular emissive section, whereas the emissive section 42 corresponding to the semi-toroidal lens 32, is for its part, an emissive section in the form of a strip forming a circle.

As regards the coverage density of the surface of the light emitting diode, if a case is considered which is comparable to that of FIG. 3, that is to say with a radius R equal to 50 microns, and an optical device formed by a central lens 31 and a concentric lens 32, with a clearance g of a width equal to 5 microns between the two lenses, it follows that the central lens 31 has a radius of 15 microns and the circular lens 32 has a width of 30 microns. In the same way as before, an elementary calculation of circular areas allows of demonstrating that 93% of the surface area available on the diode is covered by the optical device.

In the same way, the totality of the emissive sections, meaning of the emissive section 41 at the centre of the light emitting diode, and the emissive ring 42 or rings if there is a plurality of semi-toroidal lenses on the surface of the diode, have a much greater overall surface area than in the case illustrated in FIGS. 2 and 3, that is to say of the localised emissive sections. This renders it possible to limit the density of current injection into the diode and consequently to limit the heating action.

The comparison made between the diode of FIGS. 2 and 3 and the diode according to the invention of FIG. 6, is evidently drawn for identical conditions regarding diode or optical fibre diameters, and does not in any way pre-establish the shape of the ohmic contact deposit 7 on the surface of the diode element as well as the clearance which is to be retained between the metallisation 7 and the outermost semi-toroidal lens of the optical device.

Figure 7:
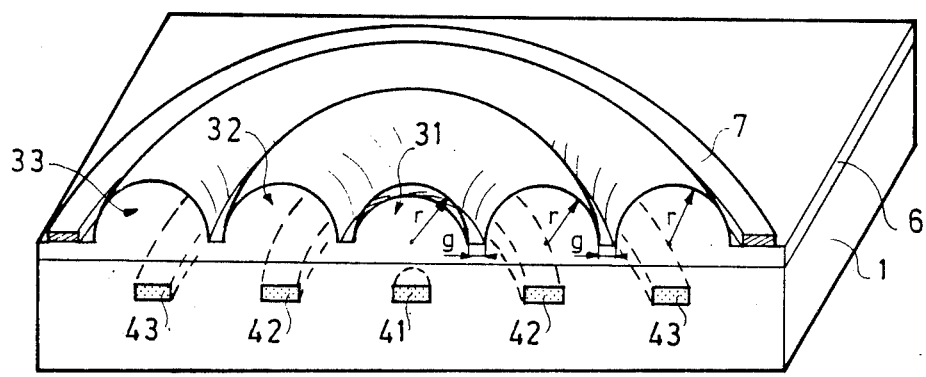
FIG. 7 illustrates a three-quarter face view within the volume of a cross-sectioned light emitting diode equipped with the optical device according to the invention.

FIG. 7 illustrates a three-quarter face view within the volume of a light emitting diode equipped with an optical device according to the invention. This view allows of demonstrating the structure more easily, since it provides the depth lacking in FIG. 6.

The diode element 1 is not shown in detail in this FIG. 7: it is quite evident that this element comprises at least one substrate and at least one active layer comprised between two containing layers, as well as the metallisations required for energisation of the diode. Only the emissive sections 41, 42 and 43 have been illustrated, since FIG. 7 illustrates a diode equipped with two semi-toroidal lenses by way of a non-restrictive example. The central emissive section 41 is a circle and the emissive sections 42 and 43 are rings.

The central lens 31 and the two semi-toroidal lenses 32 and 33 have a cross-section in this figure which is substantially that of a semi-circle. This represents no more than one form of embodiment of a diode equipped with the optical device of the invention since the convexity of the central lens and of the semi-toroidal lenses is determined by the environmental conditions, meaning the distance between an emissive section like 41a and the lens 31 allocated to the same on the one hand, and the distance between the said lens 31 and the optical fibre on the other hand. As a result, the lenses constituting the system according to the invention may have a curvature which is restricted to a fraction of a circle smaller than a semi-circle.

The maximum efficiency of the device is obtained moreover with lenses whereof the diameter in the case of the central lens 31, or the width in the case of the toroidal lenses 32 and 33, amounts to say four times the width of the emitter strip 41 or 42. The dimensions of the convergent lens are equally coupled to the radius of curvature r of each of the lenses, this radius being limited by the thickness of the layers deposited which may actually be obtained, that is to say being a maximum of say 25 microns in materials of the nature of Ga Al As, and in conditions appropriate to produce a satisfactory optical system.

The advantages of this kind of optical structure are: a
  great compactness of integration as compared to a structure comprising several small circular lenses,
  an overall diameter of the diode and of the optical system it carries in proportion to that of the core of the optical fibres, the circular structure comprising a circular lens and a torus being superior from this point of view to the structure comprising semi-cylindrical lenses,
  a structure having a high-efficiency optical output, improving the concentration of the light rays emerging from the emissive sections of the light emitting diode by a factor of 3 to direct these towards an optical fibre,
  an improvement of the operating conditions of the diode, since there is an increase of he surface of the current injection areas, that is to say of the emissive sections 41, 42, 43, . . . which allows of operating at lesser density and consequently in more satisfactory thermal conditions,
  a great ease of implementation by means of the collective machining techniques identical to those applied for the circular lenses of FIGS. 1 and 2.

Figure 8:
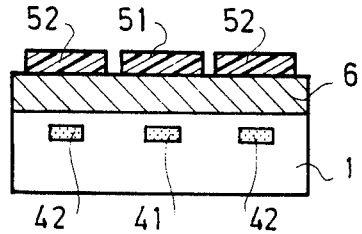
FIG. 8 illustrates the first stage in the production process of the optical device.
Figure 9:
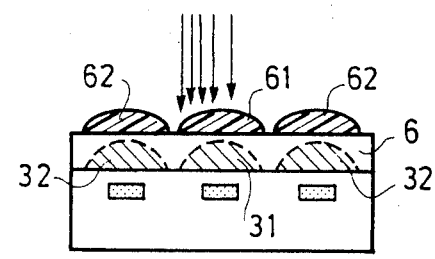
FIG. 9 illustrates the second stage of the production process of the optical device of the light emitting diode in accordance with the invention.

FIGS. 8 and 9 render it possible to recall this known process of optical application which is known, and restate the same rapidly. The element 1 of a light emitting diode as well as the emissive sections 41 and 42 are illustrated in very diagrammatical manner by FIG. 8. The diode structure which had already received the various containing, active and other layers, which need not be dealt with since they lie outside the field of the invention, then has a thick layer 6 deposited on the diode surface opposed to that of the substrate. This thick layer 6 should perforce be produced from a material transparent to the wavelength of the light emitted by the diode: if the diode is based on Ga As and Ga Al As, the layer 6 will perforce comprise aluminium in order to be transparent. This layer may be produced by a variety of techniques, some not being of interest as regards speed and economy of production, others being recommended more especially, such as liquid deposition or organometallic deposition.

A layer of masking resin is deposited on the free surface of the layer 6, and is then engraved to produce an impression 51 which corresponds to the future central circular lens 31 and at least one impression 52 of annular shape which corresponds to the future first semi-toroidal lens 32.

FIG. 9 illustrates the next stage of production of the optical system. By heating the resin layer under strictly controlled conditions, the islets 51 and 52 of resin are deformed and form the islets 61 and 62 by capillary stresses and flowage, which thereupon have a circular lens shape in the case of the islet 61 and of a semi-toroidal lens in the case of the islet 62.

The islets 61 and 62 do not form the optical system according to the invention but merely the masks allowing of cutting the optical device in the layer of semiconductive material 6 by ionic machining. As a matter of fact, the organic masking resin is eroded twice as slowly as the semi-conductive material under the impacts of the ions of the ion beam. The layer 6 of crystalline material is thus machined at a speed differing in accordance with the thickness of the resin mask deposited on the same: when the machining operation is completed, the central lens and the semi-toroidal lens or lenses 31 and 32 are produced and these have been illustrated in the form of pecked lines in the layer 6 in this FIG. 9.

The description of the invention has been given on the basis of the case in which the optical system comprises one or two semi-toroidal lenses only: this evidently represents merely a simplification of the figures, but the invention may be applied in the case in which a light emitting diode coupled to a device of a larger size than an optical fibre comprises a plurality of semi-toroidal lenses.

Furthermore, for the sake of homogeneity, all the drawings illustrate a light emitting diode of the top emitting kind, but it is quite obvious that this kind of optical system is equally appropriate for a "Burrus" type diode whereof the substrate is reconstituted above the diode which is thereupon welded to its base via the deposited layers.

Finally, the internal structure of the diode in the manner of a semiconductive devices does not limit the scope of the invention which relates to an optical system for concentrating light rays intended to improve the output of existing light emitting diodes. The invention will consequently be specified by means of the following claims.

What is claimed is:

1. An optical device for concentrating the light radiation emitted by a light emitting diode, comprising at least one emissive section in the form of a strip provided in the active layer of the said diode, the said optical device having formed in a layer deposited on the surface of the diode in the path of the light rays and consisting of a material transparent to the wavelength of the radiation emitted by the diode, at least one planoconvex lenticular element associated with the emissive section of the active layer, this lenticular element having finite radius of curvature in a plane at right angles to the strip of emissive section, and an infinite radius of curvature in a plane tangent to the same strip of emissive section, said optical device further comprising a contact surface metallization formed on said layer.

2. An optical device as claimed in claim 1, wherein the strip of the emissive section of the light emitting diode being linear, the lenticular element associated with the same is a semi-cylindrical lens.

3. An optical device as claimed in claim 1, wherein the strip of the emissive section of the light emitting diode being annular, the lenticular element associated with the same is a semi-toroidal lens.

4. An optical device as claimed in claim 1, wherein at least one semi-toroidal lens associated with an annular emissive section surrounds and is concentric with respect to a central planoconvex and circular lens of the same radius of curvature as the semi-toroidal lens and associated with another circular emissive section.

5. An optical device as claimed in claim 1, wherein the layer in which is fashioned the optical device is a ternary compound of arsenic, gallium and aluminium, in the case in which the light emitting diode is produced from materials of groups III to V, such as arsenic and gallium.

6. An optical device according to claim 2, wherein the width of the lenses at the level of the surface of the light emitting diode is approximately four times the width of the strip of the emissive section.

7. An optical device according to claim 4, wherein the width of the lenses at the level of the surface of the light emiting diode is approximately four times the width of the strip of the emissive section.

8. An optical device according to claim 2, wherein said light emitting diode comprises a plurality of emissive sections in the form of mutually parallel rectilinear strips.

9. An optical device according to claim 4, wherein said light emitting diode comprises a central emissive section and a plurality of emissive sections in the form of rings concentric with respect to the central emissive section.

10. An optical device accoding to claim 8, wherein said light emitting diode is of the top emitting kind, and said optical device is provided on the surface opposed to that of the substrate.

11. An optical device according to claim 9, wherein said light emitting diode is of the top emitting kind, and said optical device is provided on the surface opposed to that of the substrate.

12. An optical device according to claim 8, wherein said light emitting diode is of the "Burrus" type, the optical device being formed in a layer between the active layer and the substrate, the light radiation being transmitted via a hole formed in the substrate.

13. An optical device according to claim 9, wherein said light emitting diode is of the "Burrus" type, the optical device being formed in a layer between the active layer and the substrate, the light radiation being transmitted via a hole formed in the substrate.

* * * * *